United States Patent
Lehtola

(10) Patent No.: US 11,018,628 B2
(45) Date of Patent: May 25, 2021

(54) ANTENNA IMPEDANCE PREDICTION VIA POWER AMPLIFIER PARAMETER

(71) Applicant: SKYWORKS SOLUTIONS, INC., Woburn, MA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 74 days.

(21) Appl. No.: 16/370,920

(22) Filed: Mar. 30, 2019

(65) Prior Publication Data

US 2019/0305728 A1 Oct. 3, 2019

Related U.S. Application Data

(60) Provisional application No. 62/651,160, filed on Mar. 31, 2018.

(51) Int. Cl.
*H03F 1/02* (2006.01)
*H04B 1/04* (2006.01)
*H03F 1/56* (2006.01)

(52) U.S. Cl.
CPC ......... *H03F 1/0288* (2013.01); *H03F 1/0277* (2013.01); *H03F 1/56* (2013.01); *H04B 1/04* (2013.01); *H03F 2200/451* (2013.01); *H04B 2001/0416* (2013.01)

(58) Field of Classification Search
CPC .............................. H03F 1/0288; H03F 1/028
See application file for complete search history.

(56) References Cited

U.S. PATENT DOCUMENTS

| | | | | |
|---|---|---|---|---|
| 7,817,973 B1* | 10/2010 | Tuo | ...... | H04B 1/0483 455/126 |
| 9,197,176 B2* | 11/2015 | Kousai | ...... | H04B 1/04 |
| 2006/0139089 A1* | 6/2006 | Bambridge | ...... | H03F 3/68 330/65 |
| 2007/0194853 A1* | 8/2007 | Mori | ...... | H03F 1/0261 330/302 |
| 2012/0105147 A1* | 5/2012 | Harris | ...... | H03F 1/0288 330/57 |
| 2013/0241657 A1* | 9/2013 | Cho | ...... | H03F 3/211 330/295 |
| 2014/0375389 A1* | 12/2014 | Jeon | ...... | H03F 1/42 330/295 |
| 2015/0155838 A1* | 6/2015 | Embar | ...... | H03F 1/56 330/295 |
| 2016/0191001 A1* | 6/2016 | Ripley | ...... | H04B 1/40 375/219 |
| 2019/0089314 A1* | 3/2019 | Sun | ...... | H03F 1/565 |

* cited by examiner

*Primary Examiner* — Patricia T Nguyen
(74) *Attorney, Agent, or Firm* — Chang & Hale LLP

(57) ABSTRACT

Antenna impedance prediction via power amplifier parameter. In some embodiments, a power amplification system can include a splitter circuit and a combiner circuit, and first and second Doherty power amplifiers implemented in a quadrature configuration between the splitter circuit and the combiner circuit, with each Doherty power amplifier including a carrier amplifier and a peaking amplifier. The power amplification system can further include a monitoring circuit configured to measure at least some of base currents associated with the carrier and peaking amplifiers of the first and second Doherty power amplifiers, and generate a signal capable of adjusting a load impedance presented to an output of the combiner circuit.

19 Claims, 13 Drawing Sheets

ANTENNA IMPEDANCE PREDICTION VIA POWER AMPLIFIER PARAMETER

CROSS-REFERENCE TO RELATED APPLICATION(S)

This application claims priority to U.S. Provisional Application No. 62/651,160 filed Mar. 31, 2018, entitled ANTENNA IMPEDANCE PREDICTION VIA POWER AMPLIFIER PARAMETER, the disclosure of which is hereby expressly incorporated by reference herein in its respective entirety.

BACKGROUND

Field

The present disclosure relates to amplifiers such as power amplifiers for radio-frequency (RF) applications.

Description of the Related Art

In radio-frequency (RF) applications, a signal to be transmitted is typically amplified by a power amplifier. Such a power amplified signal is routed to an antenna for transmission.

For an efficient transfer of power between the power amplifier and the antenna, it is desirable to have the power amplified signal on its way to the antenna be presented with an appropriate impedance.

SUMMARY

In accordance with a number of implementations, the present disclosure relates to a power amplification system that includes a splitter circuit and a combiner circuit, and first and second Doherty power amplifiers implemented in a quadrature configuration between the splitter circuit and the combiner circuit. Each Doherty power amplifier includes a carrier amplifier and a peaking amplifier. The power amplification system further includes a monitoring circuit configured to measure at least some of base currents associated with the carrier and peaking amplifiers of the first and second Doherty power amplifiers, and generate a signal capable of adjusting a load impedance presented to an output of the combiner circuit.

In some embodiments, each of the carrier and peaking amplifiers of each Doherty power amplifier can include an input amplification stage and an output amplification stage, such that the at least some of the base currents measured by the monitoring circuit correspond to at least some of base currents associated with the output amplification stages. Each output amplification stage can include a cascode arrangement of first and second amplifying transistors, such that the at least some of the base currents measured by the monitoring circuit correspond to at least some of cascode base currents associated with the second amplifying transistors. The first amplifying transistor can be configured as a common emitter device, and the second amplifying transistor can be configured as a common base device.

In some embodiments, the at least some of the base currents measured by the monitoring circuit can include a cascode base current of the carrier amplifier of the first Doherty power amplifier, CR0_ICSD, a cascode base current of the peaking amplifier of the first Doherty power amplifier, PK0_ICSD, a cascode base current of the carrier amplifier of the second Doherty power amplifier, CR90_ICSD, and a cascode base current of the peaking amplifier of the second Doherty power amplifier, PK90_ICSD. In some embodiments, the at least some of the base currents measured by the monitoring circuit can include a ratio of a cascode base current of the carrier amplifier of the first Doherty power amplifier and a cascode base current of the carrier amplifier of the second Doherty power amplifier, CR0_ICSD/CR90_ICSD, and a ratio of a cascode base current of the peaking amplifier of the first Doherty power amplifier and a cascode base current of the peaking amplifier of the second Doherty power amplifier, PK0_ICSD/PK90_ICSD.

In some embodiments, the load impedance presented to the output of the combiner circuit can include an impedance of an antenna.

In some teachings, the present disclosure relates to a radio-frequency front-end system that includes a power amplifier configured to amplify a signal for transmission, and including an amplifying transistor configured to operate with a base current. The radio-frequency front-end system further includes an antenna in communication with the power amplifier and configured to support the transmission of the amplified signal. The radio-frequency front-end system further includes an antenna tuner implemented between the power amplifier and the antenna, and configured to adjust an antenna load impedance presented to the power amplifier. The radio-frequency front-end system further includes an impedance control circuit configured to control the antenna tuner to adjust the antenna load impedance based on a variation of the base current of the amplifying transistor.

In some embodiments, the radio-frequency front-end system can be substantially free of a directional coupler between the power amplifier and the antenna.

In some embodiments, the power amplifier can include first and second Doherty power amplifiers, with each Doherty power amplifier including a carrier amplifier and a peaking amplifier. Each of the first and second Doherty power amplifiers can include a Doherty splitter circuit and a Doherty combiner circuit, such that the respective carrier and peaking amplifiers are electrically between the Doherty splitter circuit and the Doherty combiner circuit.

In some embodiments, the first and second Doherty power amplifiers can be implemented in a quadrature configuration. In some embodiments, the radio-frequency front-end system can further include a quadrature splitter circuit and a quadrature combiner circuit, such that the first and second Doherty power amplifiers are electrically between the quadrature splitter circuit and the quadrature combiner circuit.

In some embodiments, each of the carrier and peaking amplifiers of each Doherty power amplifier can include an input amplification stage and an output amplification stage, such that at least the output amplification stage is configured to operate with the base current. Each output amplification stage can include a cascode arrangement of a common emitter transistor and a common base transistor, such that at least the common base transistor is configured to operate with the base current.

In some embodiments, the radio-frequency front-end system can further include a low-noise amplifier configured to amplify a received signal. The low-noise amplifier can be in communication with the antenna, such that the antenna receives and provides the received signal to the low-noise amplifier. In some embodiments, the radio-frequency front-end system can further include a duplexer configured to support duplexing operation of the power amplifier and the low-noise amplifier.

In some embodiments, the variation of the base current of the amplifying transistor can include a change in the base current resulting from a voltage saturation condition of the amplifying transistor.

In some implementations, the present disclosure relates to a wireless device that includes a power amplification system configured to amplify a signal for transmission, and including a splitter circuit and a combiner circuit. The power amplifier circuit further includes first and second Doherty power amplifiers implemented in a quadrature configuration between the splitter circuit and the combiner circuit, with each Doherty power amplifier including a carrier amplifier and a peaking amplifier. The power amplifier circuit further includes a monitoring circuit configured to measure at least some of base currents associated with the carrier and peaking amplifiers of the first and second Doherty power amplifiers, and generate a signal capable of adjusting a load impedance presented to an output of the combiner circuit. The wireless device further includes an antenna in communication with the power amplification system and configured to allow the transmission of the amplified signal, with the load impedance including an impedance of the antenna.

In some implementations, the present disclosure relates to a wireless device that includes a power amplifier configured to amplify a signal for transmission, and including an amplifying transistor configured to operate with a base current. The wireless device further includes an antenna in communication with the power amplifier and configured to support the transmission of the amplified signal. The wireless device further includes an antenna tuner implemented between the power amplifier and the antenna, and configured to adjust an antenna load impedance presented to the power amplifier. The wireless device further includes an impedance control circuit configured to control the antenna tuner to adjust the antenna load impedance based on a variation of the base current of the amplifying transistor.

According to some teachings, the present disclosure relates to a method for tuning an antenna. The method includes amplifying a signal for transmission, with the amplifying including operating a transistor with a base current. The method further includes monitoring the base current. The method further includes adjusting an antenna tuner to thereby adjust an antenna load impedance presented to the amplified signal, with the adjusting being based on a variation of the monitored base current.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

An impedance (or VSWR (voltage standing wave ratio)) presented to a radio-frequency (RF) front end by an antenna of a wireless device (e.g., a handset) is often not at a desired value such as 50 Ohms (or 1:1 VSWR). Factors such as size constraints, metal cases, and support for wide bandwidths can make such a desired antenna impedance difficult even under ideal conditions. During operation of the wireless device, the VSWR presented to the RF front end can degrade further due to the proximity of the antenna to, for example, user's hand, head, and/or other objects.

A high VSWR presented to the RF front end by the antenna typically leads to poor receive sensitivity and/or degraded transmit performance. Notable parameters that can degrade on the transmit side can include radiated power, current consumption, and/or linearity.

Figure 1:
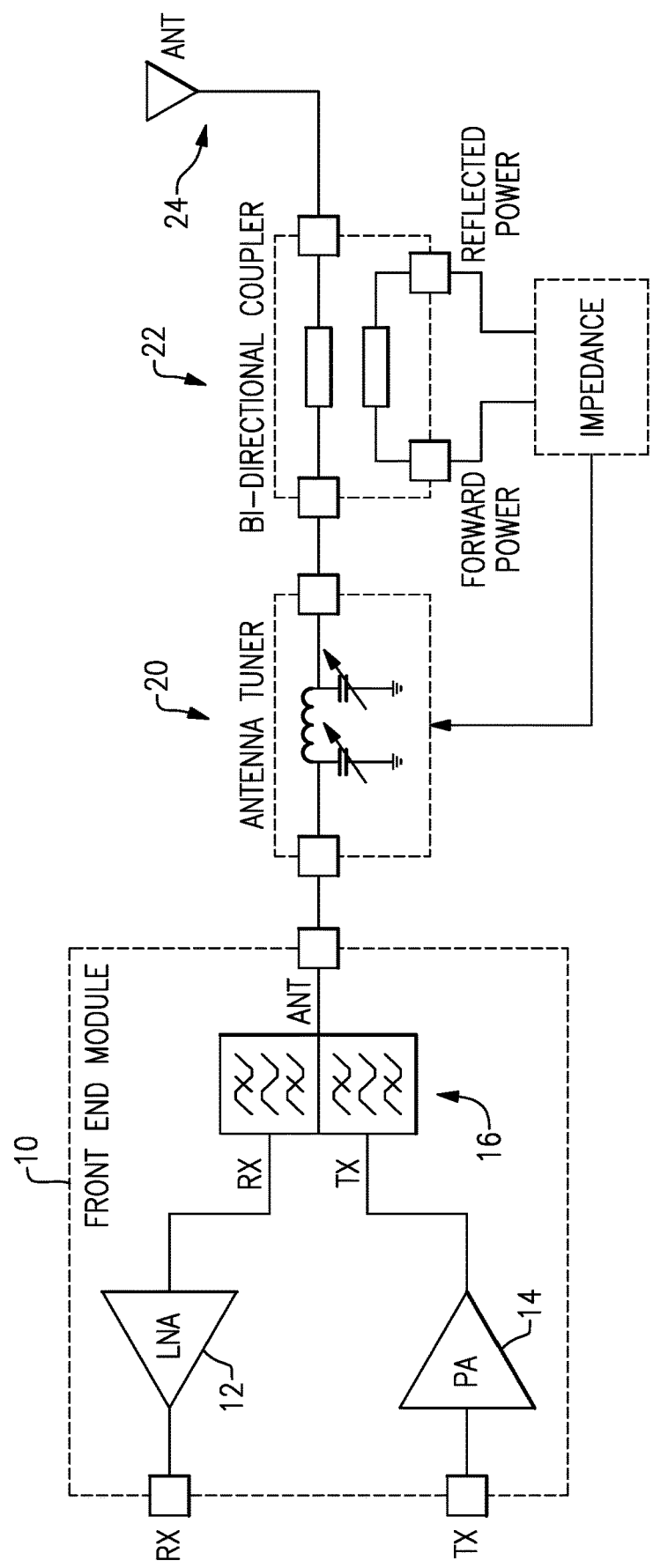
FIG. 1 shows an antenna tuner and a bi-directional coupler that can be utilized to compensate for a poor voltage standing wave ratio (VSWR) presented by an antenna for a signal amplified by a power amplifier.

To overcome the foregoing performance degradation, an antenna tuner and a bi-directional coupler can be utilized to compensate for the poor VSWR presented by the antenna. FIG. 1 shows an example of such an approach, in which antenna tuner 20 and bi-directional coupler 22 are implemented between a power amplifier 14 of a front-end module 10 and an antenna 24. In the example of FIG. 1, the front-end module 10 is shown to also include a low-noise amplifier 12 for amplification of a received signal from the antenna 24, and a duplexer 16 can be provided to support duplexing operations (e.g., frequency-division duplexing).

In the example configuration of FIG. 1, an antenna impedance can be predicted based on a ratio of forward and reflected transmit (Tx) powers. It is noted that with a perfect match (i.e., 1:1 VSWR), reflected power=0; and with an infinite VSWR, reflected power=delivered power. Based on the foregoing ratio of forward and Tx powers, the antenna tuner 20 can be adjusted to minimize or reduce the reflected power.

Referring to the example of FIG. 1, it is noted that the bi-directional coupler 22 typically has physical size and signal loss implications. For example, a commercially available bi-directional coupler can have dimensions of approximately 2 mm×1.25 mm, and an insertion loss of approximately 0.23 dB. Such an insertion loss can result in degradation of receive (Rx) sensitivity by approximately 0.23 dB and/or an addition of ~20 mA of transmit current.

In some approaches, an antenna can be directly connected to an RF front-end to address the antenna-impedance variation problem. In such approaches, there is typically no compensation for antenna VSWR, and degradation can occur in Rx sensitivity and/or Tx performance.

Figure 2:
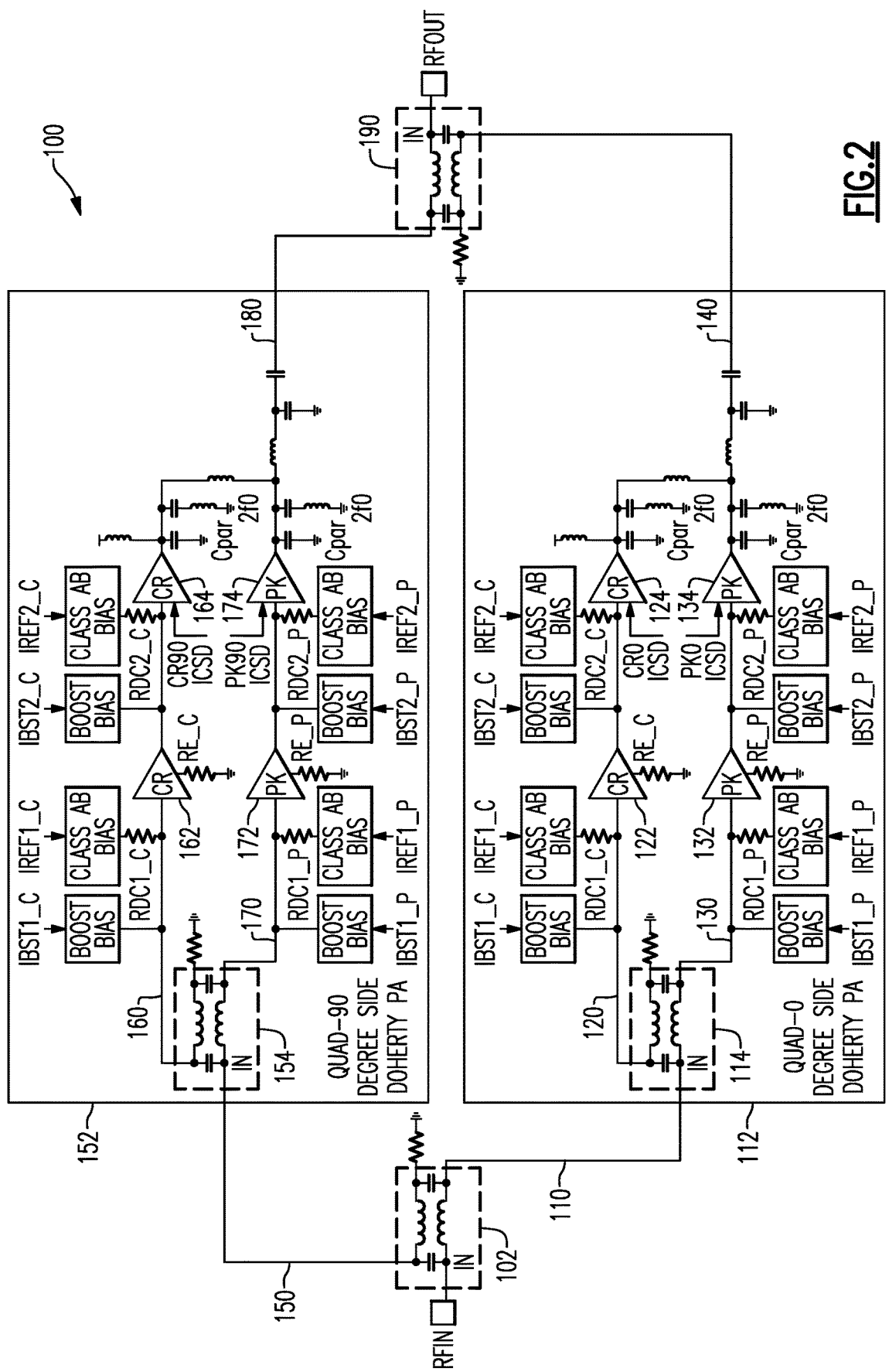
FIG. 2 shows a configuration where one or more base currents of a quadrature hybrid coupled Doherty power amplifier can be monitored to predict an impedance presented to a radio-frequency (RF) front-end by an antenna.

In some embodiments, a current associated with an amplifying transistor of a power amplifier can be monitored and utilized to predict or estimate an impedance presented by an antenna to an RF front-end. For example, FIG. 2 shows a power amplifier configuration where one or more base currents of a quadrature hybrid coupled Doherty power amplifier 100 can be monitored to predict or estimate an impedance presented by an antenna coupled to an output (RFOUT) node of the power amplifier. It will be understood that while various examples are described herein in the context of the quadrature hybrid coupled Doherty power amplifier, one or more features of the present disclosure can also be implemented in other types of power amplifiers. It will also be understood that one or more features of the present disclosure can be implemented in power amplifiers based on bipolar junction transistors, field-effect transistors, or any combination thereof.

Referring to the example of FIG. 2, it is noted that a number of advantageous features can be provided. For example, the impedance can be predicted or estimated by use of DC parameters; thus, an RF power detector is not needed. In another example, a bi-directional coupler is not needed to control an antenna tuner, thereby improving performance with respect to insertion loss, Rx sensitivity and/or Tx power/current.

In the example of FIG. 2, the quadrature hybrid coupled Doherty power amplifier 100 includes two Doherty power amplifiers 112, 152 implemented in a quadrature configuration. The first Doherty power amplifier 112 is also indicated as QUAD—0 Degree side Doherty PA, and the second Doherty power amplifier 152 is also indicated as QUAD—90 Degree side Doherty PA. A signal at an input node (RFIN) is shown to be split into the respective quadrature signals by a splitter circuit 102, and combined by a combiner circuit 190 after amplification by the respective Doherty power amplifiers (112, 152) to reduce the power amplifier's sensitivity to mismatch. More particularly, the input signal is shown to be split by the splitter circuit 102 to provide a first split signal to a first input path 110 for the first Doherty power amplifier 112, and to provide a second split signal to a second input path 150 for the second Doherty power amplifier 152.

The amplified signal from the first Doherty power amplifier 112 is shown to be provided to a first output path 140, and the amplified signal from the second Doherty power amplifier 152 is shown to be provided to a first output path 180. The first and second amplified signals of the first and second output paths 140, 180 are shown to be combined by the combiner circuit 190 and provide an output signal at the output node RFOUT.

Referring to FIG. 2, each of the first and second Doherty power amplifiers 112, 152 includes a carrier amplifier (CR) and a peaking amplifier (PK). More particularly, the first quadrature input signal associated with the first input path 110 is shown to be split into a carrier amplification path 120 and a peaking amplification path 130, by a splitter circuit 114. The carrier amplification path 120 can include one or more carrier amplification stages. For example, an input stage 122 and an output stage 124 can be provided for the carrier amplification path 120. Similarly, the peaking amplification path 130 can include one or more peaking amplification stages. For example, an input stage 132 and an output stage 134 can be provided for the peaking amplification path 130.

Similarly, and referring to the example of FIG. 2, the second quadrature input signal associated with the first input path 150 is shown to be split into a carrier amplification path 160 and a peaking amplification path 170, by a splitter circuit 154. The carrier amplification path 160 can include one or more carrier amplification stages. For example, an input stage 162 and an output stage 164 can be provided for the carrier amplification path 160. Similarly, the peaking amplification path 170 can include one or more peaking amplification stages. For example, an input stage 172 and an output stage 174 can be provided for the peaking amplification path 170.

Accordingly, base currents associated with the amplification stages can include: (1) Carrier—90 degree side base current ("CR90_ICSD") associated with the amplification stage 164, (2) Peaking—90 degree side base current ("CR90_ICSD") associated with the amplification stage 174, (3) Carrier—0 degree side base current ("CR0_ICSD") associated with the amplification stage 124, and (4) Peaking—0 degree side base current ("CR0_ICSD") associated with the amplification stage 134.

Figure 3:
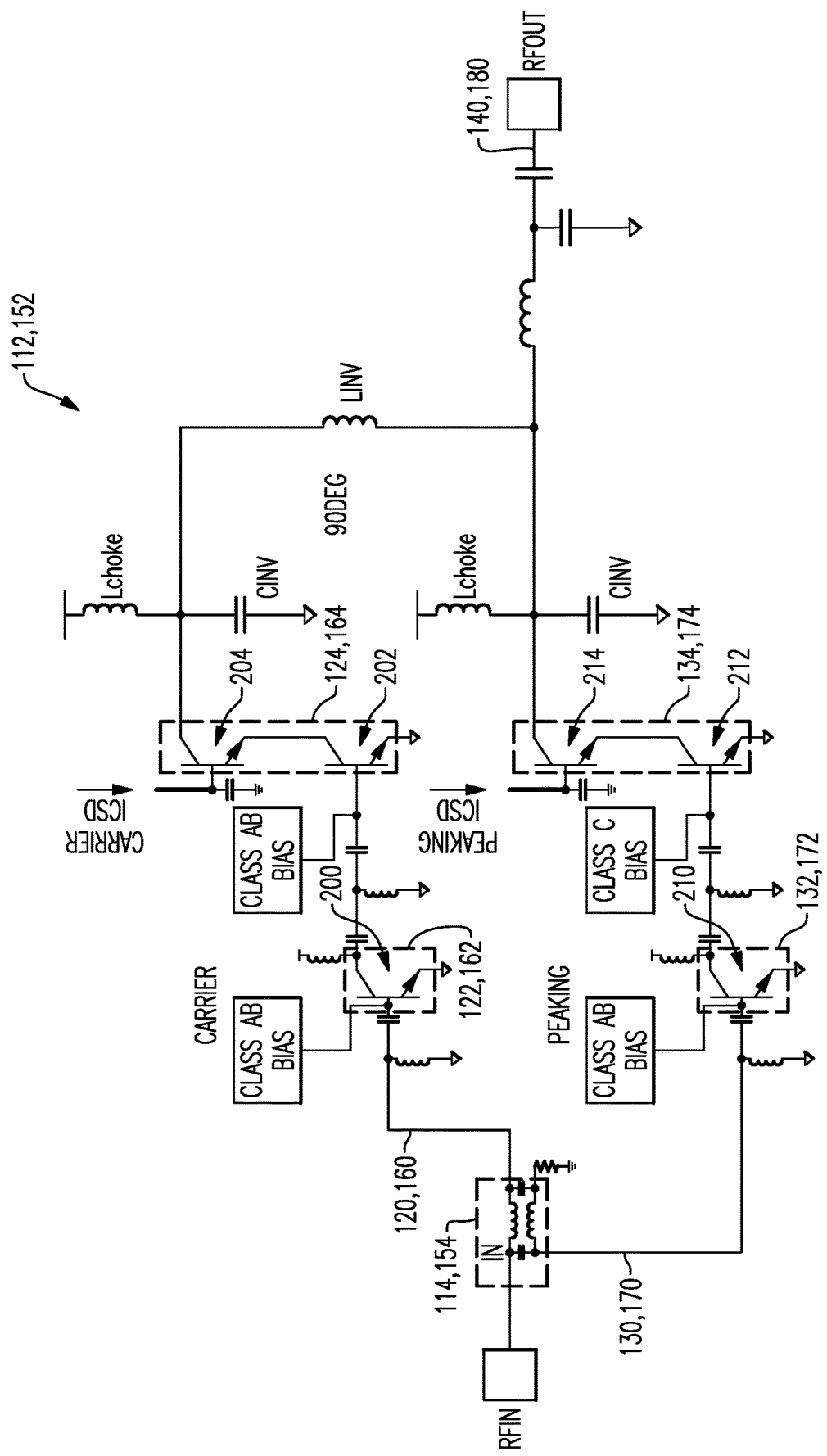
FIG. 3 shows a more specific example of each Doherty power amplifier of FIG. 2.

FIG. 3 shows a more specific example of each Doherty power amplifier (112 or 152) of FIG. 2. Accordingly, input (RFIN) and output (RFOUT) nodes are at the input and output portions of the respective rectangle (QUAD—0 Degree side Doherty PA or QUAD—90 Degree side Doherty PA) in FIG. 2.

In the example of FIG. 3, a splitter circuit (114 or 154), a carrier signal path (120 or 160), a peaking signal path (130 or 170), a carrier input stage (122 or 162), a peaking input stage (132 or 172), a carrier output stage (124 or 164), a peaking output stage (134 or 174), and a combined signal path (140 or 180) can correspond to respective parts of FIG. 2.

FIG. 3 shows that in some embodiments, the carrier input stage (122 or 162) can include an amplifying transistor 200 configured to receive an input signal through its base and generate an amplified signal through its collector. Such an amplifying transistor can be provided with, for example, Class AB bias signal to the base. Similarly, the peaking input stage (132 or 172) can include an amplifying transistor 210 configured to receive an input signal through its base and generate an amplified signal through its collector. Such an amplifying transistor can be provided with, for example, Class AB bias signal to the base.

FIG. 3 also shows that in some embodiments, the carrier output stage (124 or 164) can include a cascode arrangement of amplifying transistors 202, 204. The amplifying transistor 202 can be configured as a common emitter so as to receive an input signal through its base and provide an amplified signal through its collector. The amplifying transistor 204 can be configured as a common base so as to receive an input signal from the collector of the transistor 202 through its emitter and provide an amplified signal through its collector.

In some embodiments, the common emitter transistor 202 can be provided with, for example, Class AB bias signal to its base. In some embodiments, the common base transistor 204 can have associated with it a cascode base current. In FIG. 3, such a cascode base current is indicated as "Carrier ICSD" and can be the base current CR0 ICSD or CR90 ICSD in FIG. 2

Similarly, in some embodiments, the peaking output stage (134 or 174) can include a cascode arrangement of amplifying transistors 212, 214. The amplifying transistor 212 can be configured as a common emitter so as to receive an input signal through its base and provide an amplified signal through its collector. The amplifying transistor 214 can be configured as a common base so as to receive an input signal from the collector of the transistor 212 through its emitter and provide an amplified signal through its collector.

In some embodiments, the common emitter transistor 212 can be provided with, for example, Class C bias signal to its base. In some embodiments, the common base transistor 214 can have associated with it a cascode base current. In FIG. 3, such a cascode base current is indicated as "Peaking ICSD" and can be the base current PK0 ICSD or PK90 ICSD in FIG. 2.

In the example of FIG. 3, an output combiner that provides appropriate characteristic impedance and phase shift can be formed by a pi network having $C_{INV}$, $L_{INV}$, $C_{INV}$.

Figure 4:
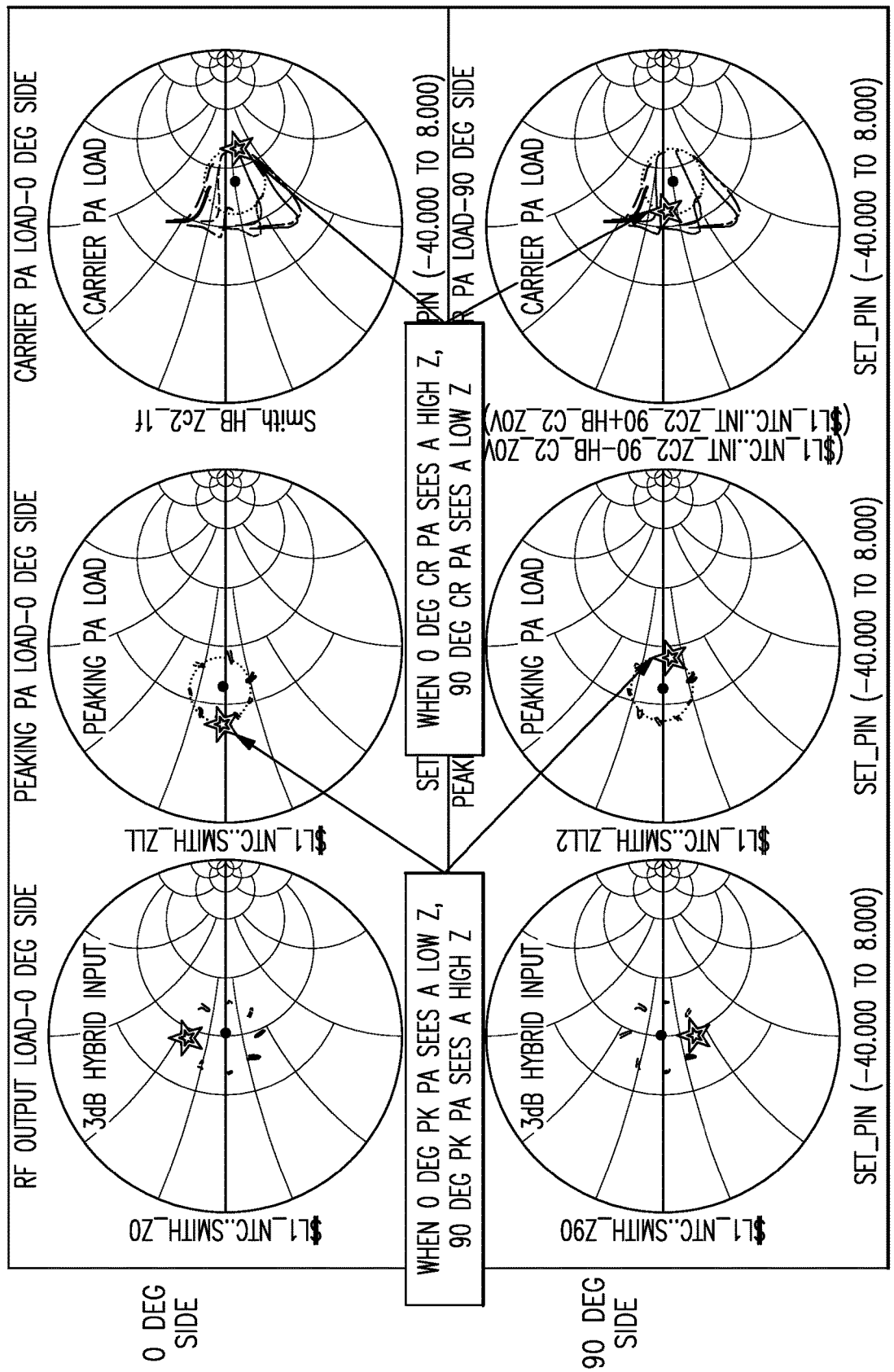
FIG. 4 shows output impedance trajectories the amplifiers in the quadrature hybrid coupled Doherty configuration of FIGS. 2 and 3.

FIG. 4 shows output impedance trajectories of each amplifier in the quadrature hybrid coupled Doherty amplifier 100 of FIGS. 2 and 3. The example plots are with a constant VSWR=1.5:1 presented to the output port of the power amplifier. Each impedance trajectory corresponds to a unique phase angle.

From the examples of FIG. 4, one can see that the quadrature hybrid coupler forces the amplifiers on the 0 degree side to be on opposite sides of the Smith chart as the amplifiers on the 90 degree side. The star-highlighted portions on the Smith charts show that when the peaking amplifier sees a high impedance on the 90 degree side, the peaking amplifier sees a low impedance on the 0 degree side. For the carrier amplifiers, when the carrier amplifier sees a high impedance on the 0 degree side, the carrier amplifier sees a low impedance on the 90 degree side.

It is noted that an amplifier that is presented with a higher impedance will be closer to a voltage saturation condition. As an amplifier approaches voltage saturation, its β (beta) parameter (Ic/Ib) degrades and the DC base current rapidly increases. Thus, by monitoring the DC base currents one can tell if the load is impedance matched (e.g., approximately 50 Ohms) or mismatched.

In the context of the example of FIG. 2, if PK90_ICSD=PK0_ICSD and CR90_ICSD=CR0_ICSD, then the base currents are approximately equal, indicating that the power amplifier 100 is driving an impedance matched (e.g., 50 Ohm) load. If the power amplifier 100 is mismatched with the load, the amplifier that sees a higher load impedance will be closer to voltage saturation and will draw more base current. For example, if PK90_ICSD>PK0_ICSD, then PK90 sees a higher load impedance. If CR90_ICSD>CR0_ICSD, then CR90 sees a higher load impedance.

Figure 5:
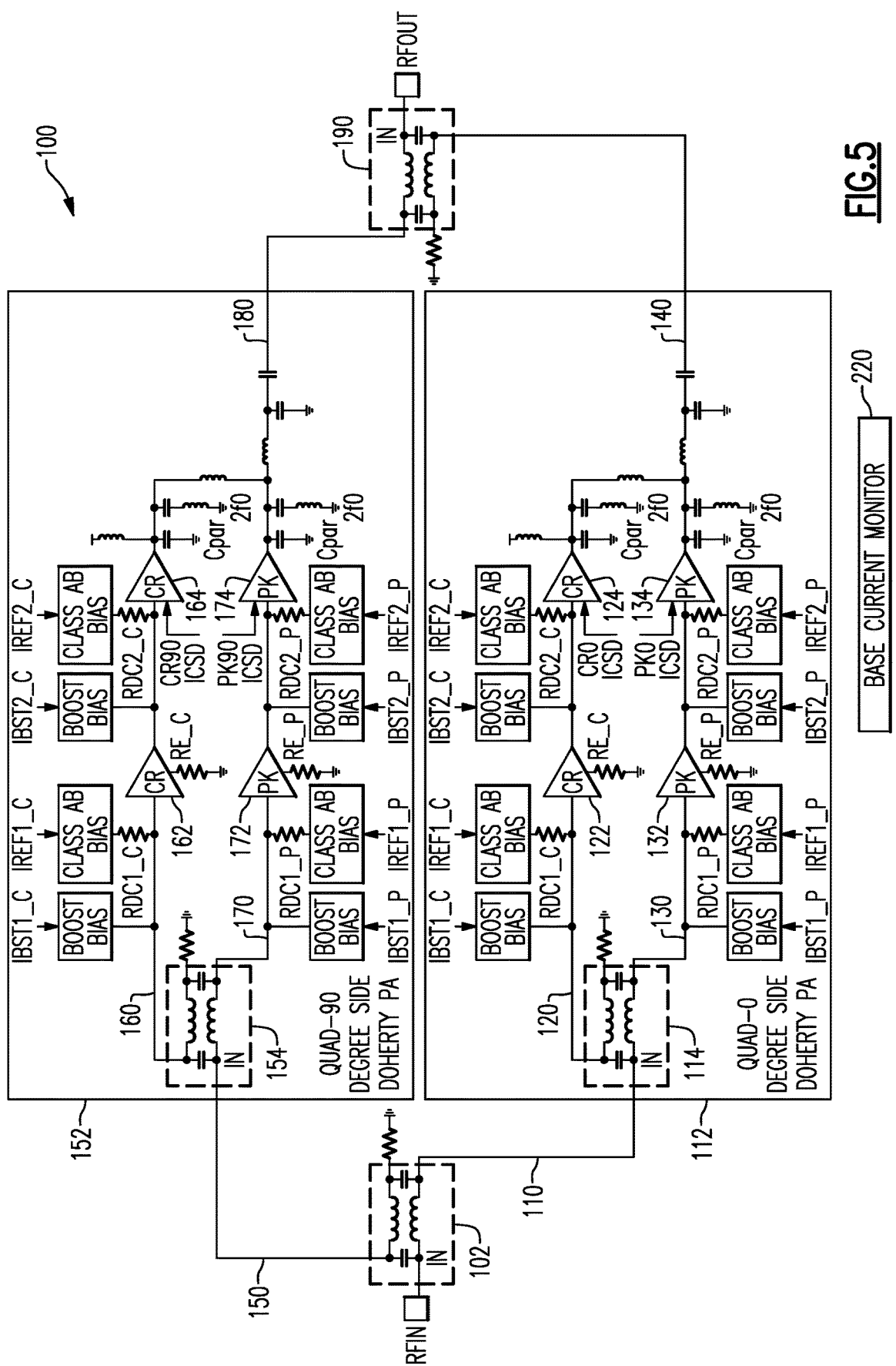
FIG. 5 shows that in some embodiments, ratios of base currents can be utilized to monitor load impedance.

Based on the foregoing examples of base currents, one can see that one or more base currents, or combinations thereof (e.g., ratios of base currents) can be utilized to monitor load impedance. Thus, FIG. 5 shows that in some embodiments, a base current monitor 220 can be provided for the power amplifier 100. In some embodiments, such a base current monitor can be part of the power amplifier 100, be a separate circuit in communication with the power amplifier 100, or some combination thereof. In the example of FIG. 5, the first and second Doherty amplifiers 112, 152 and the related input and output configurations can be similar to the example of FIG. 2. In the example of FIG. 5, ratios CR90_ICSD/CR0_ICSD and PK90_ICSD/PK0_ICSD can be utilized to monitor load impedance. It will be understood that other base current(s) and/or combinations thereof can be utilized to monitor load impedance.

Figure 6:
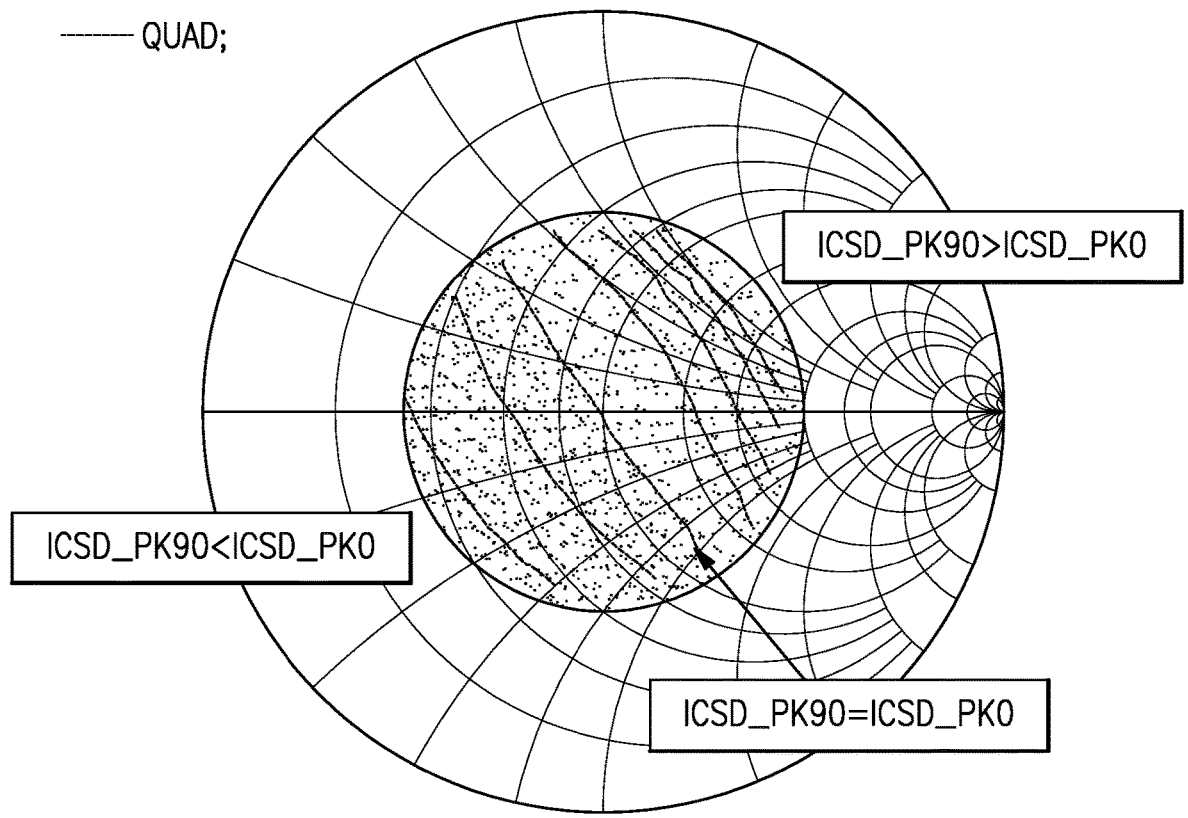
FIG. 6 shows an example ratio plotted versus load impedance on a Smith chart, for the example power amplifier of FIG. 5.

FIG. 6 shows a ratio of PK90_ICSD/PK0_ICSD plotted versus load impedance on a Smith chart, for the example power amplifier 100 of FIG. 5. The upper right shaded area corresponds to a condition where PK90_ICSD>PK0_ICSD, and the lower left shaded area corresponds to a condition where PK90_ICSD<PK0_ICSD. The curve separating the foregoing two areas corresponds to a condition where PK90_ICSD=PK0_ICSD.

Figure 7:
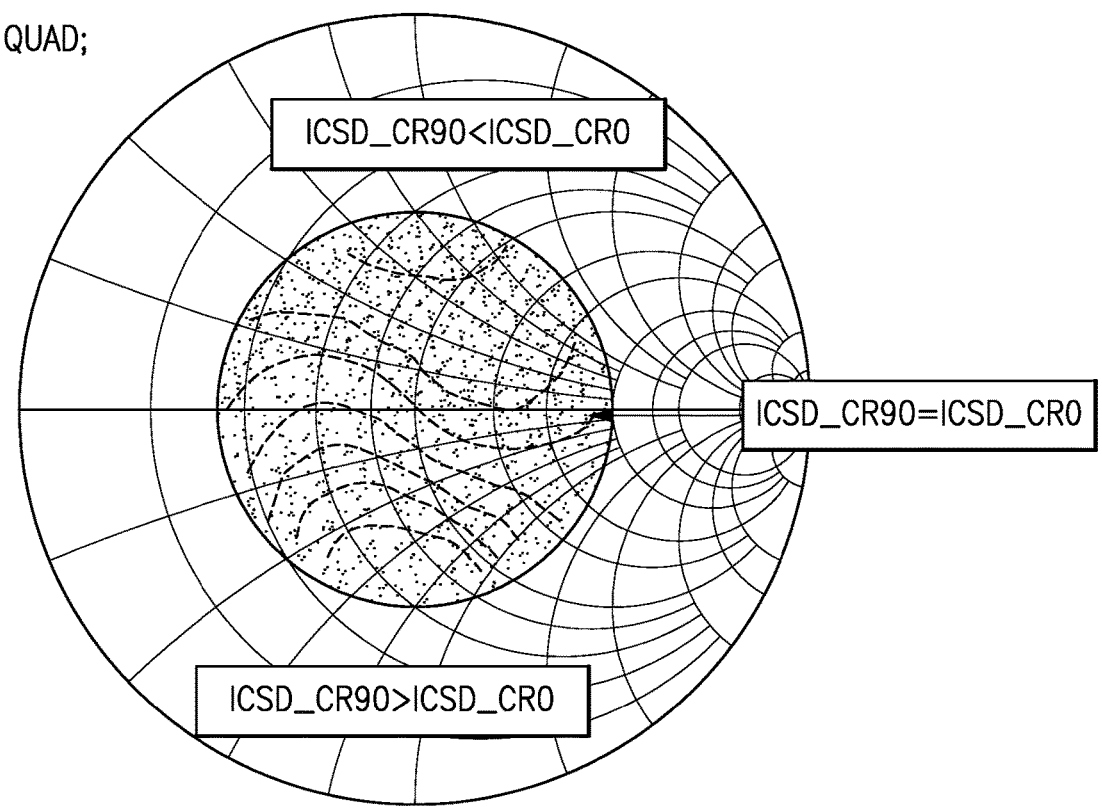
FIG. 7 shows another ratio plotted versus load impedance on a Smith chart, for the example power amplifier of FIG. 5.

FIG. 7 shows the ratio of CR90_ICSD/CR0_ICSD plotted versus load impedance on a Smith chart. The lower shaded area corresponds to a condition where CR90_ICSD>CR0_ICSD, and the upper shaded area corresponds to a condition where CR90_ICSD<CR0_ICSD. The curve separating the foregoing two areas corresponds to a condition where CR90_ICSD=CR0_ICSD.

Figure 8:
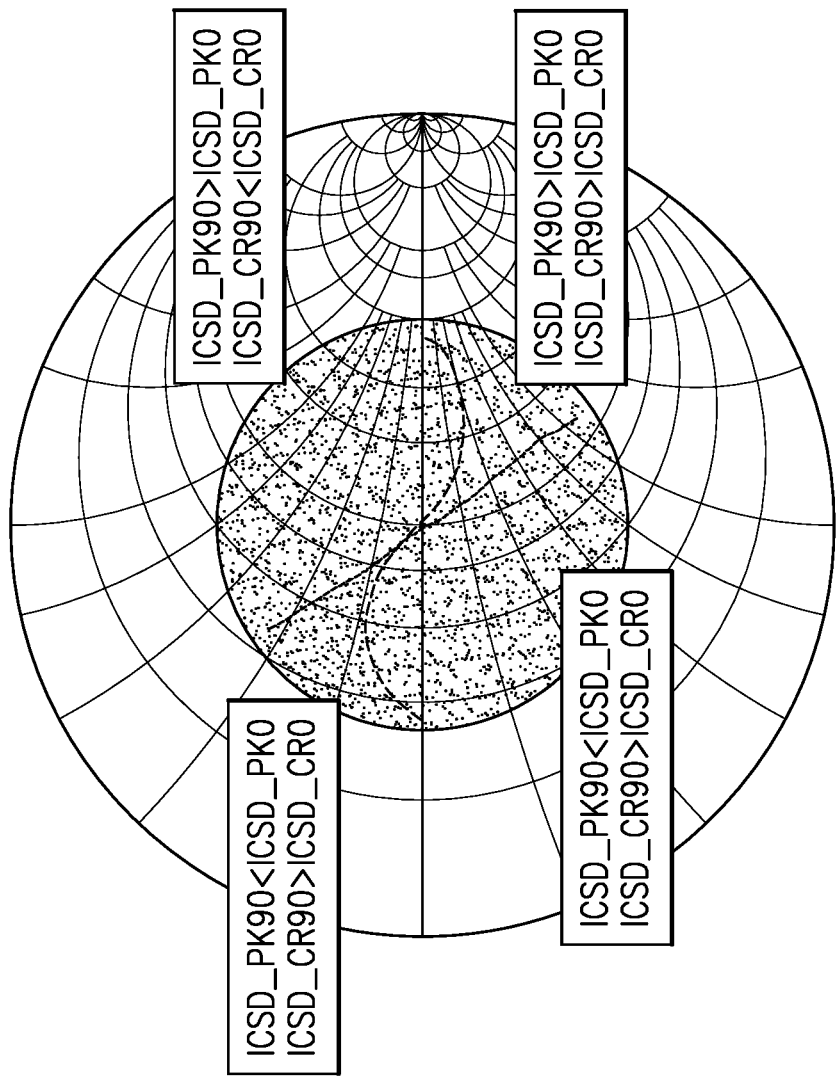
FIG. 8 shows both of the example ratios of FIGS. 6 and 7.

FIG. 8 shows both of the ratios of PK90_ICSD/PK0_ICSD (similar to the example of FIG. 6) and CR90_ICSD/CR0_ICSD (similar to the example of FIG. 7). Thus, one can see that by monitoring these two ratio parameters (CR90_ICSD/CR0_ICSD and PK90_ICSD/PK0_ICSD), the output impedance can be identified on a Smith chart.

Figure 9:
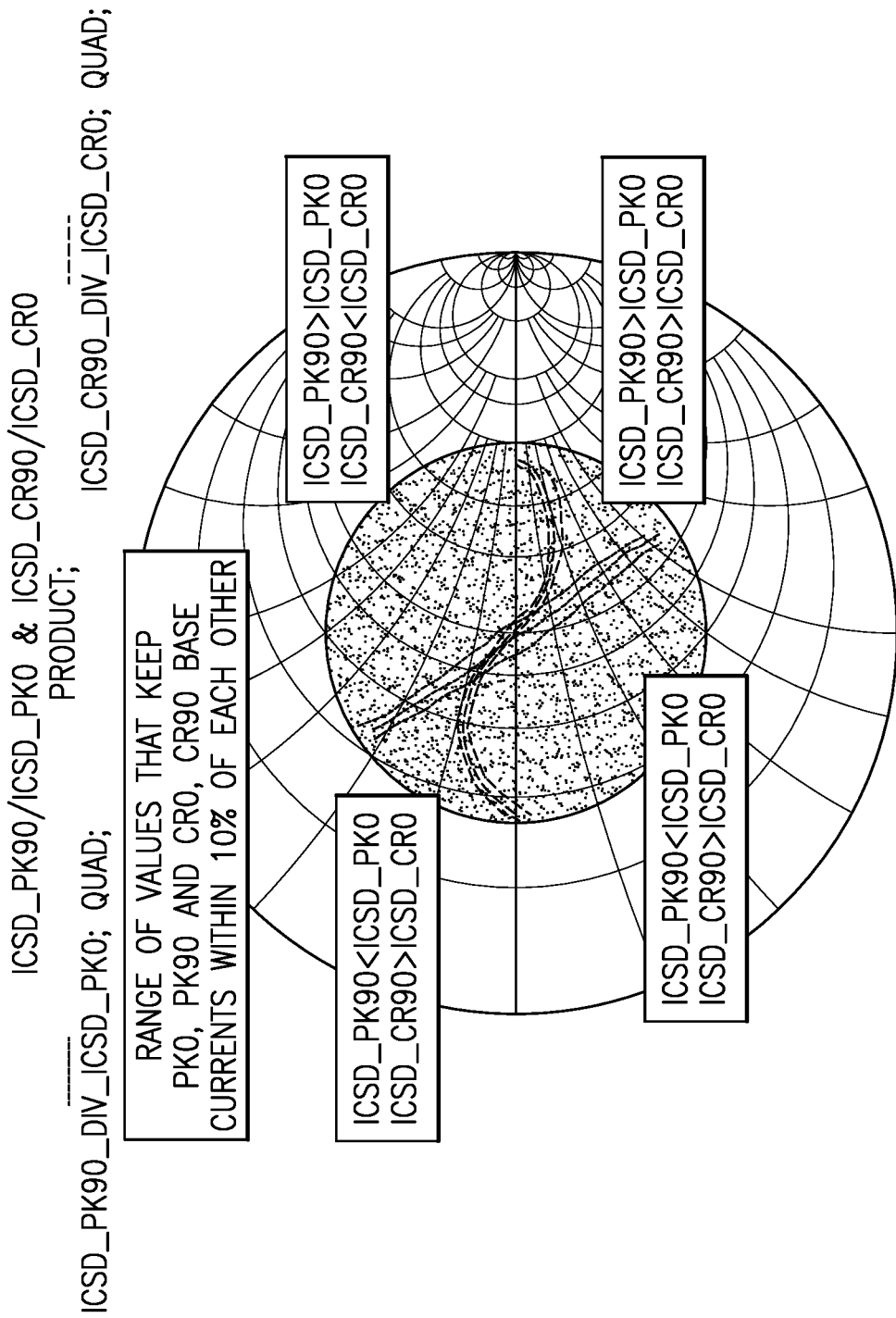
FIG. 9 shows a region of impedance values that can be presented to the example power amplifier of FIG. 5 to keep respective base currents within a selected range.

FIG. 9 shows a region of impedance values that can be presented to the example power amplifier 100 of FIG. 5 to keep respective base currents (e.g., PK0,PK90 and CR0, CR90) within a selected range (e.g., within 10% of each other). In the example of FIG. 9, a 3:1 load VSWR can be reduced to the indicated region.

In some embodiments, if the monitored base currents indicate that the load impedance is outside of the desired impedance region (e.g., if either or both of the respective base currents PK0,PK90 and CR0,CR90 differ greater than 10%), then the load impedance (e.g., antenna impedance) presented to the power amplifier can be adjusted to provide a desired value (e.g., within the desired impedance region).

Figure 10:
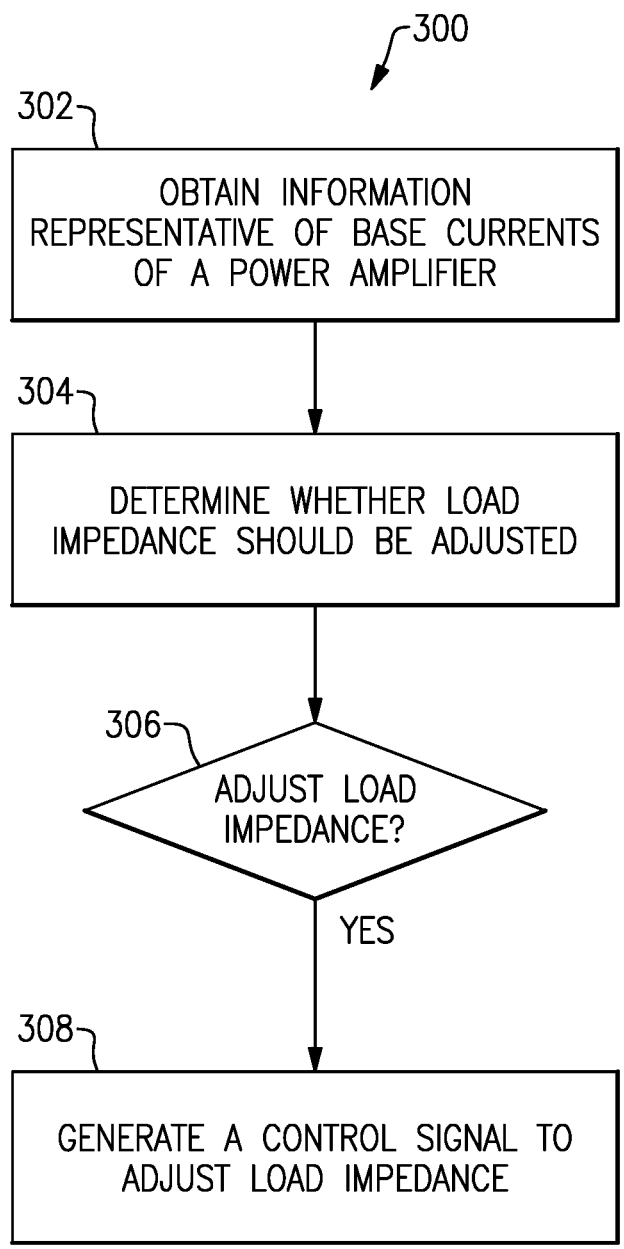
FIG. 10 shows an example process that can be implemented by a controller.

FIG. 10 shows a process 300 that can be implemented by, for example, a controller associated with operation of a power amplifier. In block 302, information representative of base currents of a power amplifier can be obtained. In some embodiments, such information can correspond to individual base currents or combinations of base currents (e.g., ratios of base currents).

In block 304, the process 300 can determine whether load impedance presented to the power amplifier should be adjusted. As described herein, such a determination can be based on deviation of base current-information from a desired range, deviation of impedance corresponding to the base current-information from a desired range, or any combination thereof.

Accordingly, if the answer is Yes in a decision block 306, the process 300 can generate a control signal in block 308 to adjust the load impedance presented to the power amplifier. In some embodiments, such a control signal can be, for example, a MIPI or MIPI-based control signal.

Figure 11:
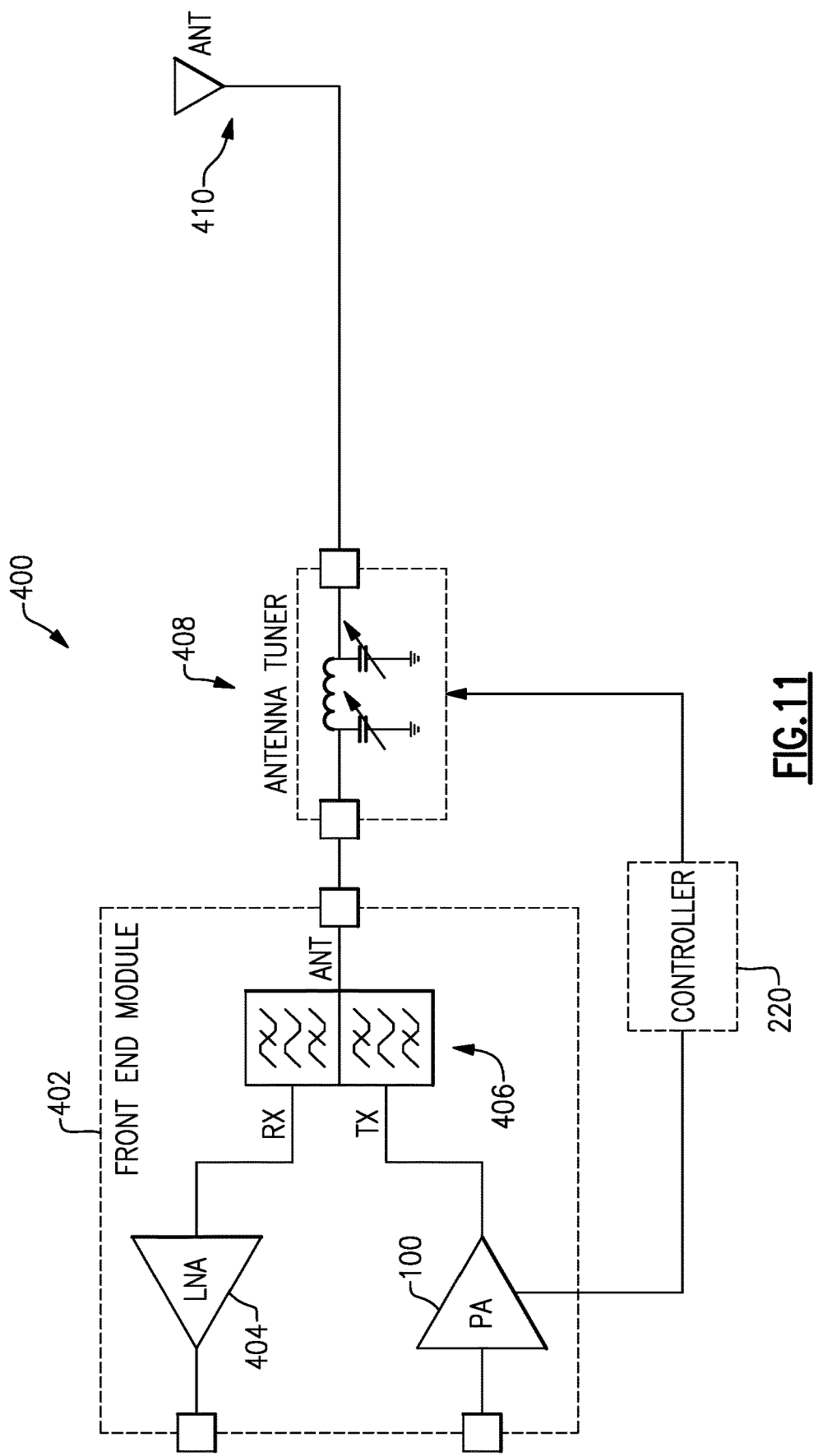
FIG. 11 shows an example front-end architecture having one or more features as described herein.

FIG. 11 shows an example front-end architecture 400 having one or more features as described herein. A front-end module 402 having a power amplifier 100 for transmit operation and a low-noise amplifier 404 for receive operation is shown to be coupled to an antenna 410 configured to support transmit and receive operations. The front-end module 402 can also include a duplexer 406 configured to support duplexing operation (e.g., frequency-division duplexing operation). In the example of FIG. 11, an antenna tuner 408 is shown to be provided between the front-end module 402 and the antenna 408.

As described herein, base currents associated with the power amplifier 100 can be monitored, and based on such base currents, impedance presented by the antenna 410 to the power amplifier 100 can be adjusted. In some embodiments, such adjustment of impedance can be provided by the antenna tuner 408. In the example of FIG. 11, such an impedance adjustment can be provided by or supported by a controller 220.

FIG. 11 also shows that in some embodiments, the transmit path between the power amplifier 100 and the antenna 410 can be free of a directional coupler (e.g., 22 in FIG. 1). As described herein, impedance adjustment functionality can be provided by monitoring of base currents in the power amplifier 100.

Figure 12:
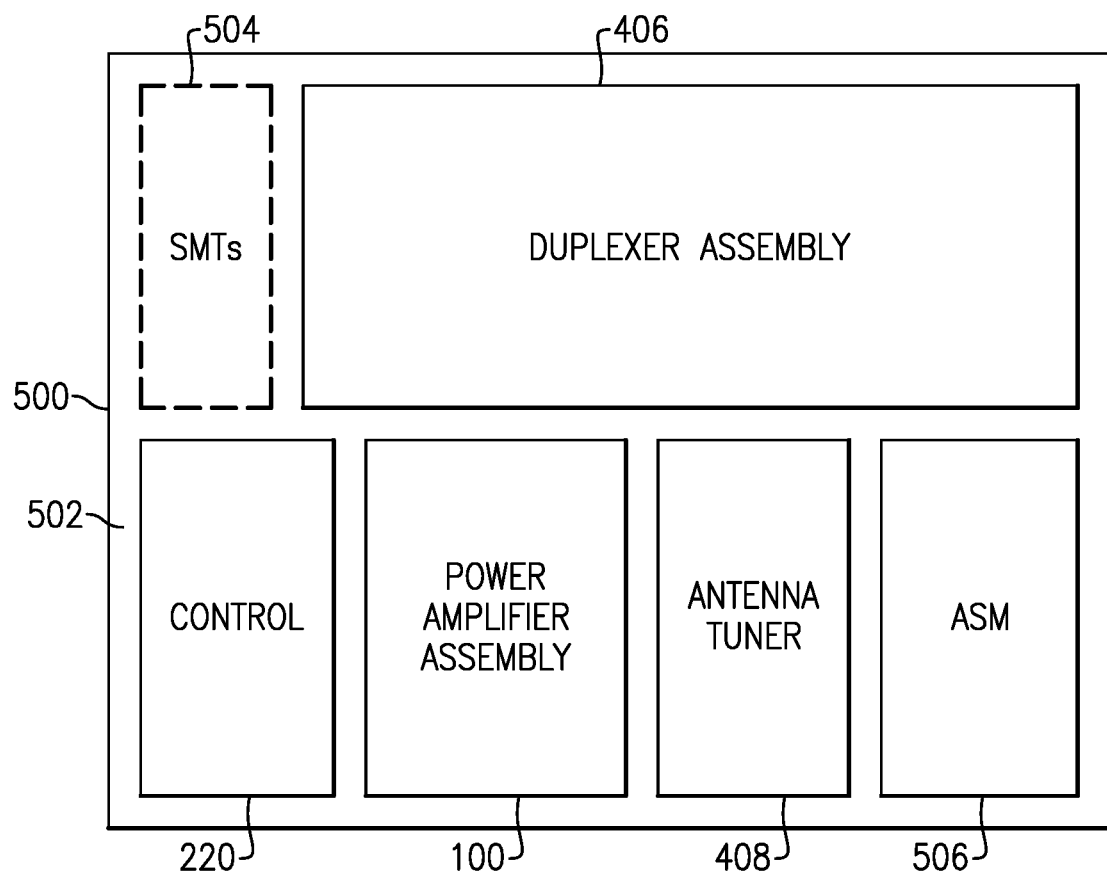
FIG. 12 shows that in some embodiments, some or all of a front-end architecture having one or more features as described herein can be implemented in a module.

FIG. 12 shows that in some embodiments, some or all of a front-end architecture having one or more features as described herein can be implemented in a module. Such a module can be, for example, a front-end module (FEM). In the example of FIG. 12, a module 500 can include a packaging substrate 502, and a number of components can be mounted on such a packaging substrate. For example, a control component 220, a power amplifier assembly 100, an antenna tuner component 408, and a duplexer assembly 406 can be mounted and/or implemented on and/or within the packaging substrate 502. Other components such as a number of SMT devices 504 and an antenna switch module (ASM) 506 can also be mounted on the packaging substrate 502. Although all of the various components are depicted as being laid out on the packaging substrate 502, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 13:
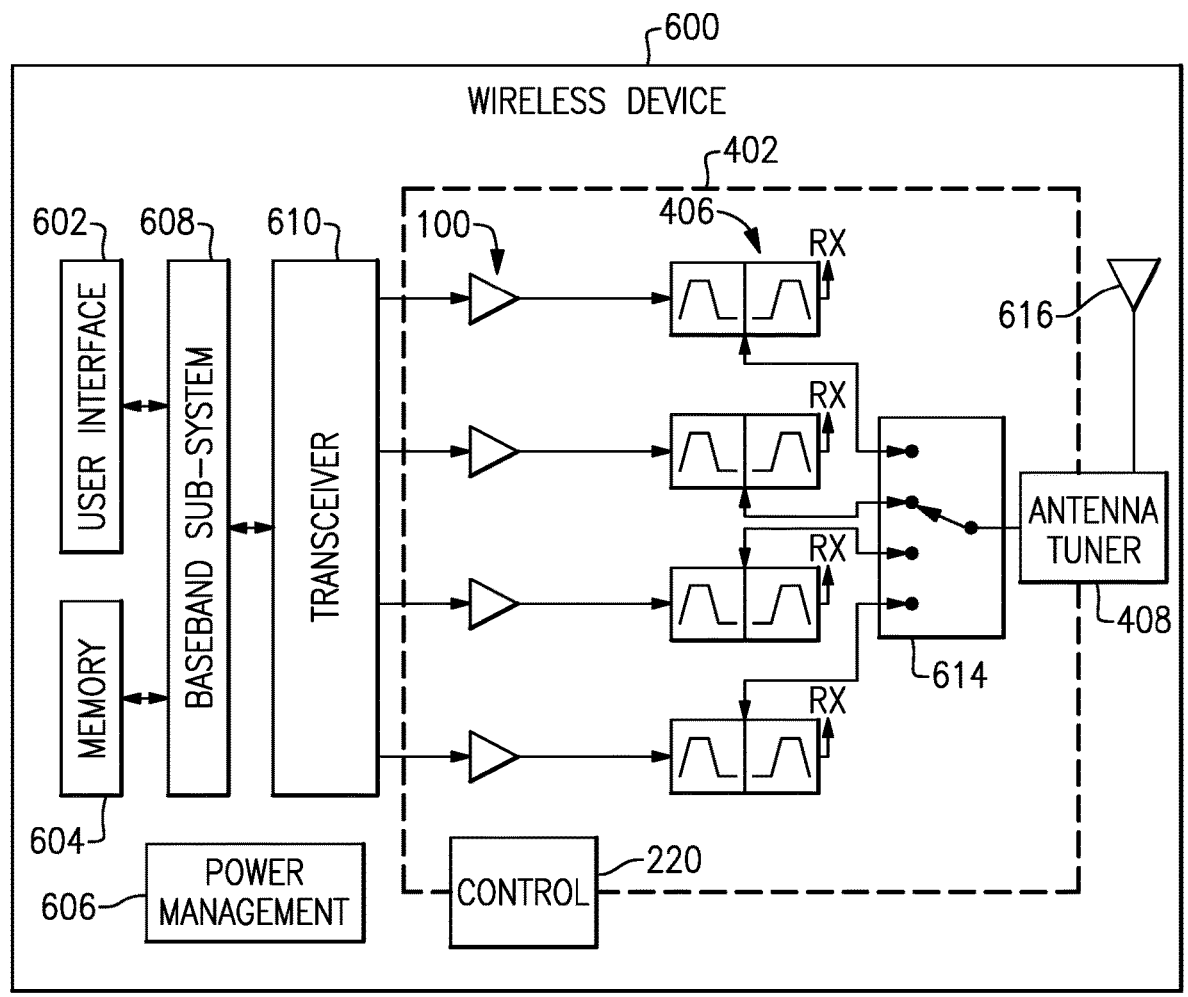
FIG. 13 depicts an example wireless device having one or more advantageous features described herein.

FIG. 13 depicts an example wireless device 600 having one or more advantageous features described herein. In the context of a module having one or more features as described herein, such a module can be generally depicted by a dashed box 402, and can be implemented as, for example, a front-end module (FEM).

Referring to FIG. 13, power amplifiers (PAs) 100 can receive their respective RF signals from a transceiver 610 that can be configured and operated in known manners to generate RF signals to be amplified and transmitted, and to process received signals. The transceiver 610 is shown to interact with a baseband sub-system 608 that is configured to provide conversion between data and/or voice signals suitable for a user and RF signals suitable for the transceiver 610. The transceiver 610 can also be in communication with a power management component 606 that is configured to manage power for the operation of the wireless device 600. Such power management can also control operations of the baseband sub-system 608 and the module 402.

The baseband sub-system 608 is shown to be connected to a user interface 602 to facilitate various input and output of voice and/or data provided to and received from the user. The baseband sub-system 608 can also be connected to a memory 604 that is configured to store data and/or instructions to facilitate the operation of the wireless device, and/or to provide storage of information for the user.

In the example wireless device 600, outputs of the PAs 100 are shown to be routed to their respective duplexers 406. Such amplified and filtered signals can be routed to an antenna 616 through an antenna switch 614 for transmission. In some embodiments, the duplexers 406 can allow transmit and receive operations to be performed simultaneously using a common antenna (e.g., 616). In FIG. 13, received signals are shown to be routed to "Rx" paths (not shown) that can include, for example, a low-noise amplifier (LNA).

As described herein, one or more features of the present disclosure can provide a number of advantages when implemented in systems such as those involving the wireless device of FIG. 13. For example, a controller 220, which may or may not be part of the module 402, can monitor base currents associated with at least some of the power amplifiers 100. Based on such monitored base currents, an antenna tuner 408 (which may or may not be part of the module 402), can be adjusted to provide a desired impedance to the corresponding power amplifier.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
   a splitter circuit and a combiner circuit;
   first and second Doherty power amplifiers implemented in a quadrature configuration between the splitter circuit and the combiner circuit, each Doherty power amplifier including a carrier amplifier and a peaking amplifier; and
   a monitoring circuit configured to measure at least some of base currents associated with the carrier and peaking amplifiers of the first and second Doherty power amplifiers, and generate a signal capable of adjusting a load impedance presented to an output of the combiner circuit.

2. The power amplification system of claim 1 wherein each of the carrier and peaking amplifiers of each Doherty power amplifier includes an input amplification stage and an output amplification stage, such that the at least some of the base currents measured by the monitoring circuit correspond to at least some of base currents associated with the output amplification stages.

3. The power amplification system of claim 2 wherein each output amplification stage includes a cascode arrangement of first and second amplifying transistors, such that the at least some of the base currents measured by the monitoring circuit correspond to at least some of cascode base currents associated with the second amplifying transistors.

4. The power amplification system of claim 3 wherein the first amplifying transistor is configured as a common emitter device, and the second amplifying transistor is configured as a common base device.

5. The power amplification system of claim 3 wherein the at least some of the base currents measured by the monitoring circuit includes a cascode base current of the carrier amplifier of the first Doherty power amplifier, CR0_ICSD, a cascode base current of the peaking amplifier of the first Doherty power amplifier, PK0_ICSD, a cascode base current of the carrier amplifier of the second Doherty power amplifier, CR90_ICSD, and a cascode base current of the peaking amplifier of the second Doherty power amplifier, PK90_ICSD.

6. The power amplification system of claim 3 wherein the at least some of the base currents measured by the monitoring circuit includes a ratio of a cascode base current of the carrier amplifier of the first Doherty power amplifier and a cascode base current of the carrier amplifier of the second Doherty power amplifier, CR0_ICSD/CR90_ICSD, and a ratio of a cascode base current of the peaking amplifier of the first Doherty power amplifier and a cascode base current of the peaking amplifier of the second Doherty power amplifier, PK0_ICSD/PK90_ICSD.

7. The power amplification system of claim 1 wherein the load impedance presented to the output of the combiner circuit includes an impedance of an antenna.

8. A radio-frequency front-end system comprising:
a power amplifier configured to amplify a signal for transmission, and including an amplifying transistor configured to operate with a base current;
an antenna in communication with the power amplifier and configured to support the transmission of the amplified signal;
an antenna tuner implemented between the power amplifier and the antenna, and configured to adjust an antenna load impedance presented to the power amplifier;
an impedance control circuit configured to control the antenna tuner to adjust the antenna load impedance based on a variation of the base current of the amplifying transistor; and
a low-noise amplifier configured to amplify a received signal.

9. The radio-frequency front-end system of claim 8, wherein the radio-frequency front-end system is substantially free of a directional coupler between the power amplifier and the antenna.

10. The radio-frequency front-end system of claim 8 wherein the power amplifier includes first and second Doherty power amplifiers, each Doherty power amplifier including a carrier amplifier and a peaking amplifier.

11. The radio-frequency front-end system of claim 10 wherein each of the first and second Doherty power amplifiers includes a Doherty splitter circuit and a Doherty combiner circuit, such that the respective carrier and peaking amplifiers are electrically between the Doherty splitter circuit and the Doherty combiner circuit.

12. The radio-frequency front-end system of claim 10 wherein the first and second Doherty power amplifiers are implemented in a quadrature configuration.

13. The radio-frequency front-end system of claim 12 further comprising a quadrature splitter circuit and a quadrature combiner circuit, such that the first and second Doherty power amplifiers are electrically between the quadrature splitter circuit and the quadrature combiner circuit.

14. The radio-frequency front-end system of claim 10 wherein each of the carrier and peaking amplifiers of each Doherty power amplifier includes an input amplification stage and an output amplification stage, such that at least the output amplification stage is configured to operate with the base current.

15. The radio-frequency front-end system of claim 14 wherein each output amplification stage includes a cascode arrangement of a common emitter transistor and a common base transistor, such that at least the common base transistor is configured to operate with the base current.

16. The radio-frequency front-end system of claim 8 wherein the low-noise amplifier is in communication with the antenna, such that the antenna receives and provides the received signal to the low-noise amplifier.

17. The radio-frequency front-end system of claim 8 further comprising a duplexer configured to support duplexing operation of the power amplifier and the low-noise amplifier.

18. The radio-frequency front-end system of claim 8 wherein the variation of the base current of the amplifying transistor includes a change in the base current resulting from a voltage saturation condition of the amplifying transistor.

19. A wireless device comprising:
a power amplifier configured to amplify a signal for transmission, and including an amplifying transistor configured to operate with a base current;
an antenna in communication with the power amplifier and configured to support the transmission of the amplified signal;
an antenna tuner implemented between the power amplifier and the antenna, and configured to adjust an antenna load impedance presented to the power amplifier;
an impedance control circuit configured to control the antenna tuner to adjust the antenna load impedance based on a variation of the base current of the amplifying transistor; and
a low-noise amplifier configured to amplify a received signal.

* * * * *